United States Patent [19]

Yuan

[11] Patent Number: 5,731,937
[45] Date of Patent: Mar. 24, 1998

[54] GIANT MAGNETORESISTIVE TRANSDUCER WITH INCREASED OUTPUT SIGNAL

[75] Inventor: Samuel W. Yuan, Sunnyvale, Calif.

[73] Assignee: Read-Rite Corporation, Milpitas, Calif.

[21] Appl. No.: 918,650

[22] Filed: Aug. 22, 1997

Related U.S. Application Data

[63] Continuation of Ser. No. 629,993, Apr. 10, 1996, abandoned.
[51] Int. Cl.⁶ .................................................. G11B 5/39
[52] U.S. Cl. ................................................... 360/113
[58] Field of Search .............................. 360/113, 125, 360/126, 123

[56] References Cited

U.S. PATENT DOCUMENTS

| | | |
|---|---|---|
| 5,390,061 | 2/1995 | Nakatani et al. ............... 360/113 |
| 5,446,613 | 8/1995 | Rottmayer ...................... 360/113 |
| 5,483,402 | 1/1996 | Batra ............................... 360/113 |
| 5,493,467 | 2/1996 | Cain et al. ...................... 360/113 |
| 5,527,626 | 6/1996 | Gijs et al. ...................... 360/113 |
| 5,557,492 | 9/1996 | Gill et al. ...................... 360/113 |
| 5,636,093 | 6/1997 | Gijs et al. ...................... 360/126 |

OTHER PUBLICATIONS

IEEE Transactions on Magnetics vol. 31, No. 6; Rottmayer et al; "... GMR Sensor in the CPP Mode" Nov. 1955.

*Primary Examiner*—Jefferson Evans
*Attorney, Agent, or Firm*—Nathan N. Kallman

[57] ABSTRACT

A thin film magnetic transducer employs a giant magnetoresistive (GMR) sensing element operating in a (CPP) current-perpendicular-to-the-plane mode. Electrical lead members in electric contact with the sensing element provide for the flow of sensor current through the giant magnetoresistive element. The height, or both the height and the width, of the GMR sensing element are greater than the height, or both the height and width respectively, of the lead members, thereby resulting in an increased output signal from the transducer.

5 Claims, 2 Drawing Sheets

GIANT MAGNETORESISTIVE TRANSDUCER WITH INCREASED OUTPUT SIGNAL

CROSS-REFERENCE TO RELATED PATENT AND APPLICATION

This application is a continuation application Ser. No. 08/629,993, filed Apr. 10, 1996, now abandoned.

U.S. Pat. No. 5,576,914, which issued Jul. 23, 1996, assigned to the same assignee as the present application, discloses a transducer employing a giant magnetoresistive (GMR) element with a magnetic bias and utilizing a sense current flow which is perpendicular-to-the-plane (CPP) of the GMR element. The patent is incorporated herein by reference.

Copending application Ser. No. 08/509,118, filed Jul. 31, 1995, assigned to the same assignee as the present application, discloses the detection of the depth of the sensing surface of a magnetoresistive (MR) sensor in an MR transducer structure by applying a magnetic field to the structure and detecting the changing electrical response of the sensor to the magnetic field as the transducer structure is lapped. That application is incorporated herein by reference.

FIELD OF THE INVENTION

This invention relates to magnetic transducers employing giant magnetoresistance in a CPP mode transducer, and relates in particular to such transducers with increased signal output.

DESCRIPTION OF THE PRIOR ART

The prior art discloses a number of types of magnetic transducers employing MR sensors which are capable of reading data from a magnetic surface at great linear densities. An MR sensor detects magnetic field signals through the resistance changes of a magnetic read element as a function of the amount and direction of magnetic flux signals being sensed by the element. In some MR heads, a set of conductors are provided on opposite sides of the MR sensor element to pass a reference current through the MR element in a current-in-the-plane (CIP) mode. This CIP mode can create problems such as shorting due to electromigration, and, additionally, a CIP mode MR element can be relatively large in size and expensive to mass produce because of its complex construction.

As an alternate to CIP mode MR heads, a type of MR sensor is utilized in which the sense current flows through the MR element in a direction perpendicular-to-the-plane (CPP) of the MR element. These CPP mode heads have a number of advantages over CIP mode heads, including the fact that the read signal produced by CPP heads is essentially independent of the signal track width. An example of such a CPP mode MR sensor in a GMR sensor is described in the publication *A New Design For An Ultra-High Density Magnetic Recording Head Using A GMR Sensor In The CPP Mode*, Rottmayer et al, IEEE Transactions On Magnetics, Volume 31, No. 6, 2597, November 1955.

SUMMARY OF THE INVENTION

The present invention utilizes a CPP/GMR head, with the sense current flowing from one shield to another through the contact leads and the sensor element located in the read-gap. In one embodiment of the invention, the GMR sensor, which can be any of the known types such as multi-layer, spin-valve, dual spin-valve, flux-valve, and spin-transistor, has a large physical height and width relative to the sensor contact leads and is employed to boost output sensitivity and enhance fabrication tolerances, while maintaining the advantage of the high density capability of the CPP mode design.

In the present structures, the output is largely independent of the sensor height, width, and even the read gap length. Their fabrication requires only an accurate geometric control of the current contact leads, which can be achieved by photolithography, thereby resulting in only a small increase in the complexity of the required manufacturing process. The output sensitivity can be enhanced relative to prior art structures by more than a factor of two for a large sensor height and physical width.

An alternative embodiment of the invention, in which the sensor track width is the same as the contact lead width but the sensor track height is greater than the contact lead height, provides simplification in transverse bias processing, while still achieving more than twice the output signal than the CPP/GMR prior art devices.

DESCRIPTION OF THE PREFERRED EMBODIMENT

Figure 1A:
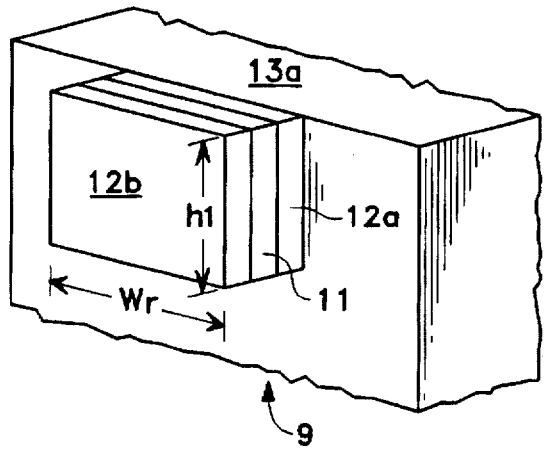
FIG. 1A is a partial isometric view of a prior art CPP/GMR transducer.

FIG. 1A shows a partial isometric view of the main elements of a prior art CPP/GMR transducer 9 including a GMR sensor element 11 disposed between a pair of electrically conductive contact or lead members 12a, 12b. A bottom shield member 13a is disposed adjacent bottom lead member 12a to provide magnetic shielding for GMR sensor element 11, as is well known in the art. For purpose of clarity, the corresponding top magnetic shield is not shown in FIG. 1A, nor in FIG. 1B. In FIG. 1A, GMR element 11 and contact lead members 12a, 12b have corresponding equal widths Wr and heights h1.

Figure 1B:
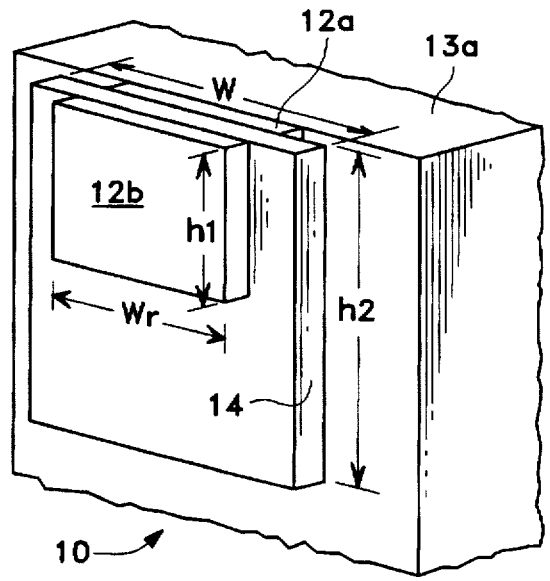
FIG. 1B is a partial isometric view of one embodiment of a CPP/GMR transducer in accordance with the present invention.

One embodiment of a transducer 10 of the present invention shown in FIG. 1B includes contact lead members 12a, 12b which are similar in size, composition and function to members 12a, 12b in FIG. 1A. In accordance with this invention, the width W and height h2 of the GMR sensor element 14 in the embodiment of FIG. 1B are considerably larger than the comparable dimensions in the prior art embodiment shown in FIG. 1A. That is, the design of FIG. 1B has a much larger GMR sensor height h2 and physical width W, although the active sensing track-width is defined largely by the width Wr of contact leads 12a, 12b, as in the FIG. 1A embodiment.

By making W>Wr, the GMR sensor is less restricted in the side-track region, thereby giving rise to a larger on-track signal than in the prior art devices, where W=Wr as in FIG. 1A. To ensure a high track-per-inch (TPI) recording and to reduce cross-talk, known longitudinal stabilization means (not shown) can be placed in the side-track region and slightly recessed from the track-edge defined by the contact lead members 12a, 12b. This results in both enhanced on-track sensitivity and better-defined cross-track response.

Figure 2:
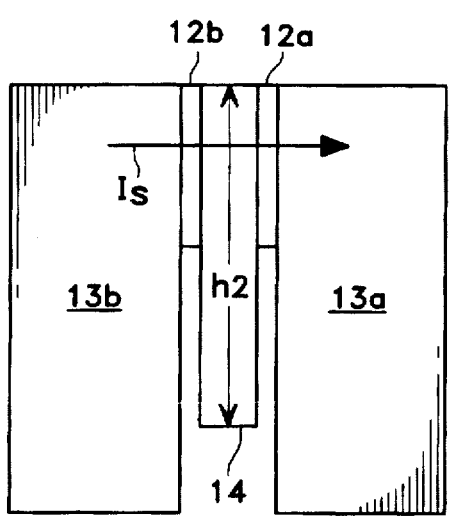
FIG. 2 is a side view of the transducer of FIG. 1B.

The actual read track-width depends on the current flow through the GMR sensor element and will be slightly larger than Wr because some current leaks to the side regions. However, the reluctance associated with these leakage paths is relatively large; therefore, the region where leakage current flows is quite concentrated and small. In the side view of FIG. 2, a sense current Is flows from a current source (not shown) through contact 12b, GMR element 14 and contact 12a, to produce a CPP mode of operation for the transducer.

The present design makes the sensor height h2 much larger than the contact height. This large sensor height effectively acts as a back flux-guide, and enhances the head efficiency by up to a factor of two. Based on transmission-line analysis, the flux decay throughout the MR stripe follows a linear pattern: the flux essentially reaches zero at the physical edge of the sensor when the sensor height is comparable to the transmission line decay length.

In the CPP/GMR mode, the "active" GMR stripe height is defined by the contact leads. Therefore, the following situation results when the sensor height is large: the flux strength at the edge of the active stripe can be significantly larger than zero, and is essentially the same as the injected flux at the air bearing surface (ABS) if the physical sensor height is infinitely large.

Figure 3:
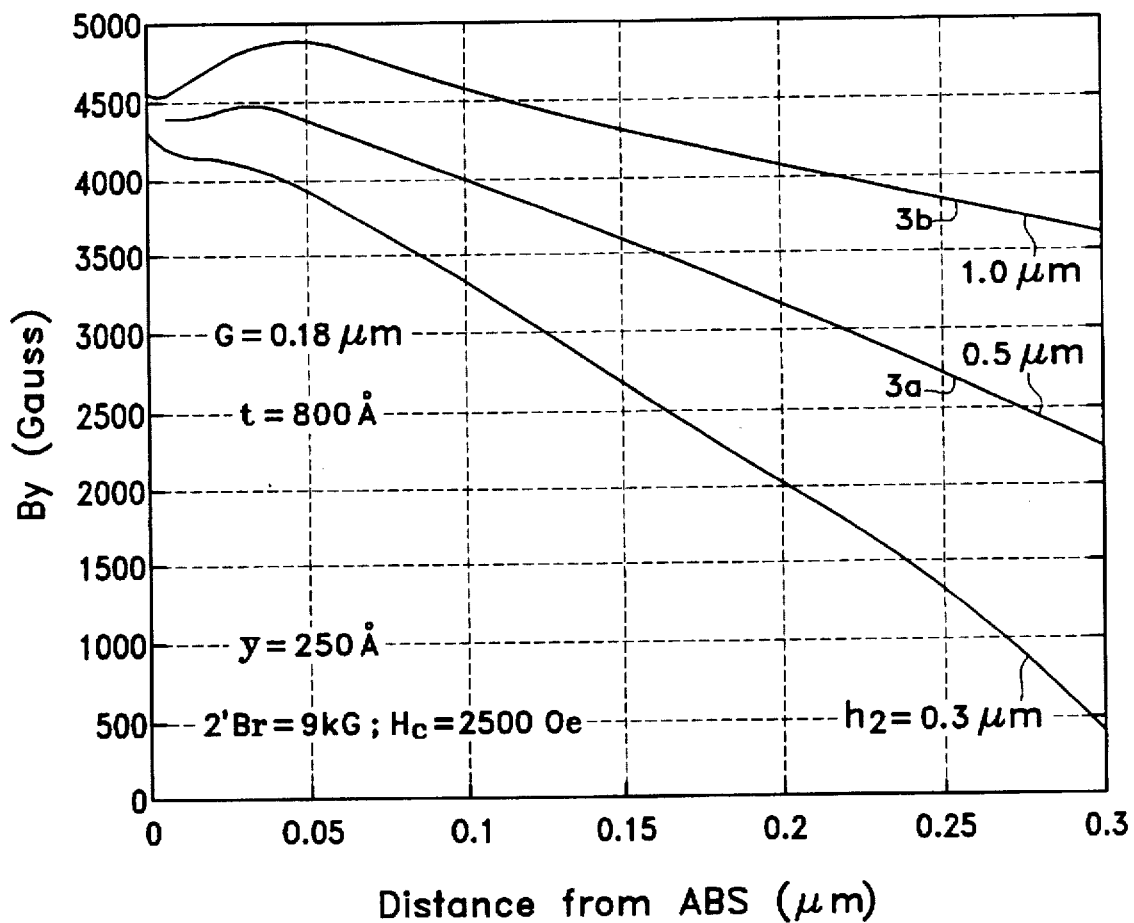
FIG. 3 is a graph illustrating the variation in flux distribution as a function of sensor spacing from the air bearing surface for different sensor heights.

FIG. 3 contains a series of graphs showing the calculated flux distribution By in gauss for various physical sensor heights as a function of the distance of the sensor element from the ABS in a transducer in accordance with this invention. The graphs of FIG. 3 were generated using a well known two-dimensional boundary element method. The contact height h1 is about 0.3 um and the gap length G is about 0.18 um. The output signal from the transducer is a function of the total area under the different curves of FIG. 3, and it can be seen that as the sensor height h2 increases relative to the contact height, as shown by curve 3a for an h2 of 0.5 um and by curve 3b for an h2 of 1.0 um, the amplitude of the output signal increases. It can also be seen from FIG. 3 that when the sensor height h2 is greater than 1 um, the ideal situation of uniform flux excitation through the entire sensor is being approached. This condition is relatively insensitive to the gap length and the sensor height once h2 is large enough.

Although transverse biasing is not discussed in detail herein, it is assumed that some form of biasing is utilized by placing magnetic biasing means adjacent to the GMR sensor throughout the entire sensor area. The leakage region beyond the contact height is again limited and depends only on the sensor thickness and material resistivities. Therefore, it is repeatable and independent of the sensor height. If this leakage is sizable, it may actually increase the output voltage, given the same sensing potential difference.

In order to achieve a large output signal, the contact leads must have very small height and width (for a larger resistance). This can be achieved by photolithographically patterning the leads. The ABS edge of the sensor can be aligned with the contact front edge by putting down a frontal photoresist material after the bottom contact is defined. Then the top contact can be self-aligned with the bottom contact based on this resist. The final definition of the ABS can be achieved, for example, by using the novel lapping procedure set out in copending application Ser. No. 08/509,118 identified above.

Figure 4:
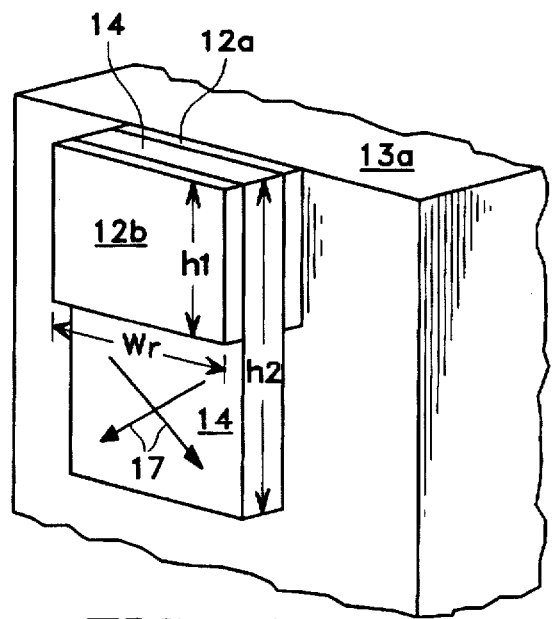
FIG. 4 is a partial isometric view of an alternate embodiment of the invention.

In an alternative design of the invention shown in FIG. 4, the sensor track-width is the same as the contact width Wr. This is to avoid any possible difficulty in self-aligning the two contact leads along the track-width direction. No longitudinal stabilization is provided in the embodiment of FIG. 4 because the sensor does not extend beyond the contact leads as it does in the embodiment shown in FIGS. 1B and 2. The self-coupling of the magnetostatics between the various layers in the sensor will stabilize the structure along the cross-track direction.

This design still entails a large sensor height h2 beyond the contact lead height h1. The demagnetizing field along the stripe height direction is reduced for such a larger height, rendering the sensor magnetization easier to rotate under external flux excitation. The benefit of virtually uniform flux distribution across the physical sensor height still remains. These two factors combine to provide more than a factor of two improvement in the signal output.

An added advantage of the design of FIG. 4 is that since Wr <h2, the shape anisotropy of the sensor favors the magnetizations to align along the vertical direction. This effect intrinsically helps the transverse biasing necessary for proper read operation with a large dynamic range. Additional transverse biasing may not be required, if the sensor aspect ratio is properly designed, which significantly simplifies the head structure and processing complexity. The properly biased magnetic state is illustrated by the arrows 17 in FIG. 4. The magnetizations in adjacent layers are anti-parallel along the cross-track direction due to magnetostatic coupling, and are parallel along the sensor height h2. This latter configuration can be established by applying a vertical initialization (or an auxiliary transverse biasing scheme), and it will tend to remain in that state because of the shape anisotropy.

What is claimed is:

1. A magnetic transducer comprising a giant magnetoresistive sensing element having top and bottom surfaces;

contact lead members in electrical contact with said top and said bottom surfaces of said sensing element to produce current flow through said sensing element in a direction perpendicular to the plane of said surfaces, said contact lead members and said surfaces of said sensing element having height and width dimensions, the height of said sensing element surfaces being 1⅔ to 3⅓ times the height of said contact lead members, so that the height of said sensing element effectively improves the efficiency of the transducer with resultant increased signal output.

2. A transducer in accordance with claim 1 including magnetic shield means located adjacent said contact lead members on the sides thereof away from said sensing element surfaces.

3. A transducer in accordance with claim 1 including magnetic transverse biasing means for magnetically biasing said sensing element.

4. A transducer in accordance with claim 1 in which the height and the width of said sensing element surfaces are greater respectively than the height and the width of said contact lead members.

5. A transducer in accordance with claim 4 including magnetic longitudinal stabilization means for magnetically stabilizing said sensing element.

* * * * *